United States Patent [19]

Hiwada et al.

[11] Patent Number: 5,293,080
[45] Date of Patent: Mar. 8, 1994

[54] METHOD AND APPARATUS FOR GENERATING TEST WAVEFORMS TO BE APPLIED TO A DEVICE UNDER TEST

[75] Inventors: Kiyoyasu Hiwada, Kanagawa; Nobuyuki Kasuga, Tokyo, both of Japan

[73] Assignee: Hewlett-Packard Company, Palo Alto, Calif.

[21] Appl. No.: 976,683

[22] Filed: Nov. 16, 1992

Related U.S. Application Data

[63] Continuation of Ser. No. 767,242, Sep. 27, 1991, abandoned.

[30] Foreign Application Priority Data

Oct. 9, 1990 [JP] Japan ................................. 2-272017

[51] Int. Cl.$^5$ ........................... H03K 4/00; H03K 5/13; H03K 7/00; H03K 17/00
[52] U.S. Cl. .................................. 307/260; 307/269; 328/63; 328/72
[58] Field of Search ..................... 307/265, 269, 272.1, 307/590, 601; 328/58, 63, 72; 371/27

[56] References Cited

U.S. PATENT DOCUMENTS

| 4,460,999 | 7/1984 | Schmidt | 371/27 |
| 4,639,919 | 1/1987 | Chang et al. | 371/27 |
| 4,998,025 | 3/1991 | watanabe | 307/269 |

OTHER PUBLICATIONS

James T. Healy, "Automatic Testing and Evaluation of Digital Integrated Circuits," Reston Publishing Co., Inc., Chapter 3, pp. 18–31.

Anthony K. Stevens, "Introduction to Component Testing," Addison-Wesley's Series on Applied Computer Engineering Topics, Chapter 2.3, pp. 21–25.

*Primary Examiner*—William L. Sikes
*Assistant Examiner*—Trong Phan

[57] ABSTRACT

A test waveform generator comprises a storage unit (1a, 1b) for storing timing information; a timing generator unit (2a, 2b) to which the timing information is input from the storage unit and which is adapted to output a timing pulse at a predetermined time on the basis of the timing information; and a waveform generating unit (3, 4) to which the pulse from the timing generator unit is input and which is adapted to output a test waveform. The timing generator unit is arranged so that the timing of the timing pulse is set with either (1) a period clock signal (CLK) serving as a reference or (2) another timing pulse serving as a reference.

12 Claims, 7 Drawing Sheets

METHOD AND APPARATUS FOR GENERATING TEST WAVEFORMS TO BE APPLIED TO A DEVICE UNDER TEST

This is a continuation of application Ser. No. 767,242, filed Sep. 27, 1991 now abandoned.

FIELD OF INVENTION

The present invention relates to test waveform generators for applying test waveforms to a device under test (DUT), e.g, in an LSI test system.

BACKGROUND OF THE INVENTION

Figure 1:
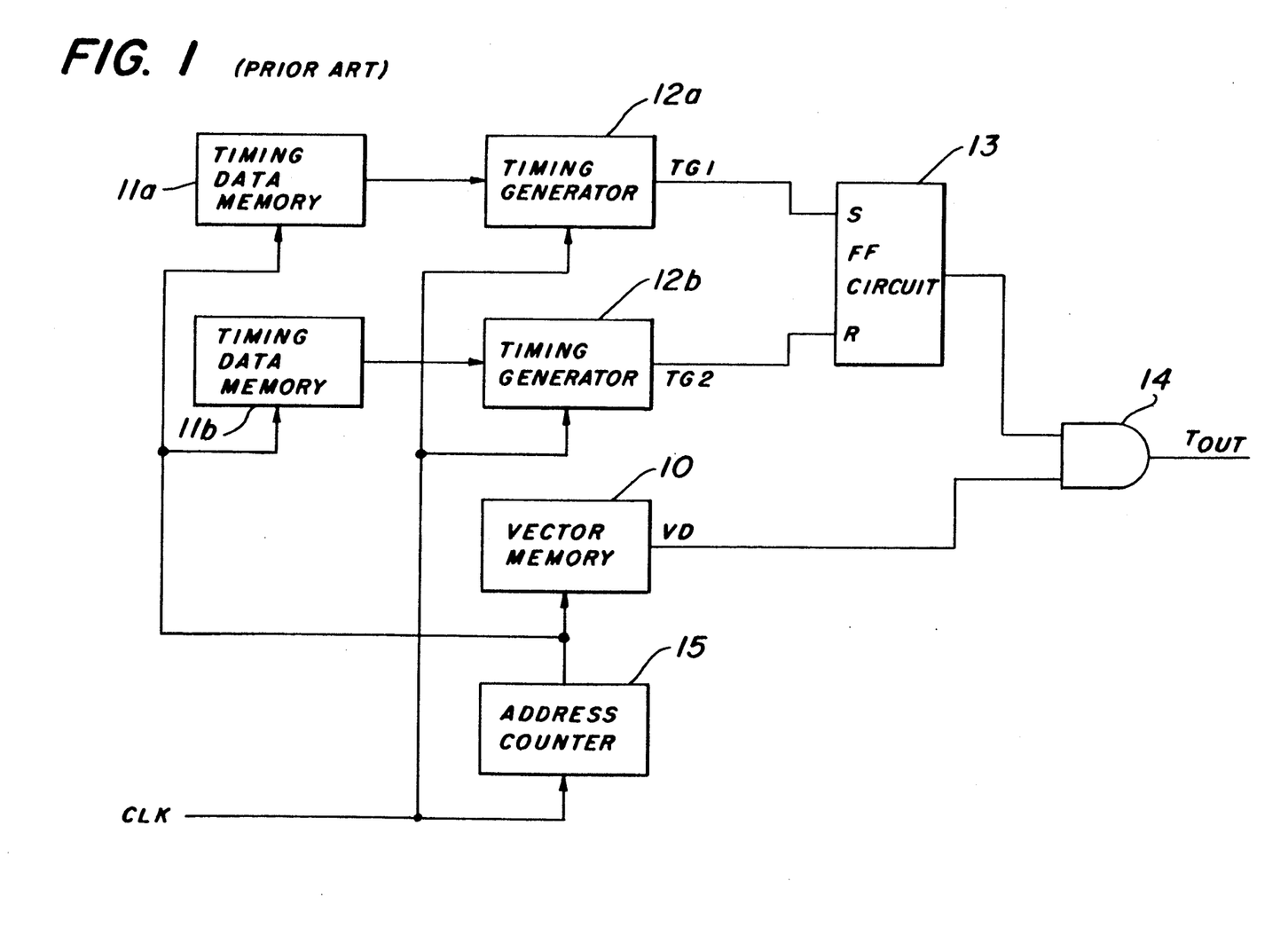
FIG. 1 is a block diagram of a conventional test waveform generator.

A typical test waveform generator is depicted in FIG. 1. With such a waveform generator, a desired test waveform $T_{OUT}$ is generated on the basis of timing pulses TG1, TG2 from timing generators 12a, 12b as well as vector information VD from a vector generator, e.g., a vector memory 10. The vector information VD is a pattern comprised of a sequence of "1"and/or "0"s, but it does not include information concerning the timing of the test waveform, i.e., the time intervals between the respective pulse waveforms that make up the test waveform. The test waveform $T_{OUT}$ of a desired format is generated by combining the vector information VD and timing pulses TG1, TG2 by a formatter, e.g., a flip-flop circuit 13 in combination with an AND gate 14.

Figure 2:
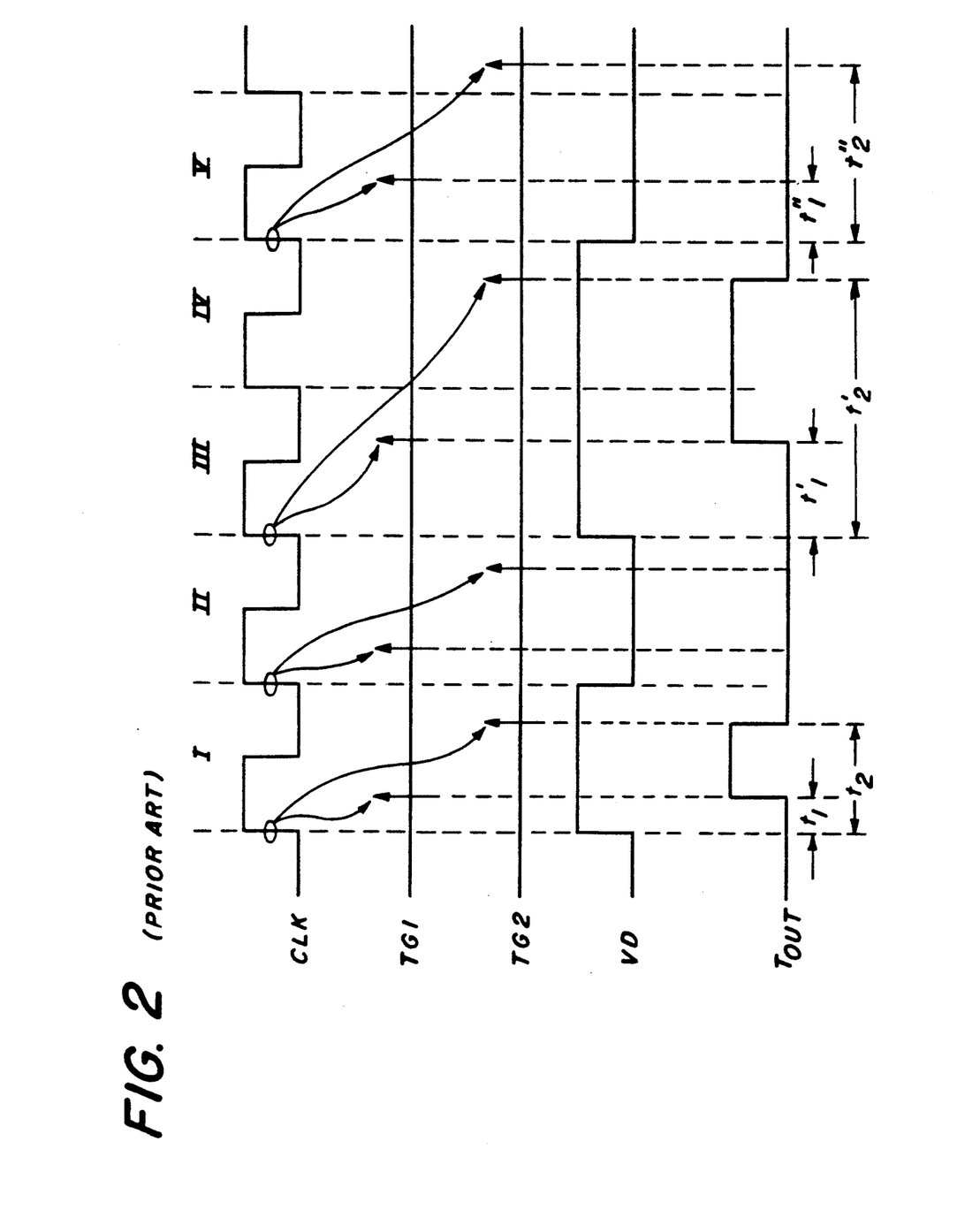
FIG. 2 is a timing chart for the block diagram shown in FIG. 1.

Referring now to FIGS. 1 and 2, timing data memories 11a, 11b output timing information (e.g., the contents of one memory includes delay times $t_1$, $t_2$ which are described below) to the timing generators 12a, 12b. The timing pulses TG1, TG2 are output by the timing generators 12a, 12b to a set terminal S and a reset terminal R of a flip-flop (FF) circuit 13 upon the lapse of delay times $t_1$, $t_2$ following the rising edge of a period clock signal CLK. Meanwhile, the vector memory 10 (corresponding to a vector generator) outputs for each period of the period clock signal CLK the vector information VD ("1" or "0") stored at an address designated by an address counter 15. The AND gate 14 then combines the vector information VD and the output of the FF circuit 13 and outputs the test waveform $T_{OUT}$.

It should be noted that in FIG. 2 the test waveform $T_{OUT}$ is of the RZ (return-to-zero) type in period I and IV and the NRZ (non-return-to-zero) type in period III, i.e., $T_{OUT}$ is in mixed form.

It should also be noted that, in a frequently-adopted alternative arrangement (not shown), timing generators are used instead of the timing data memories 11a, 11b, fixed timing pulses TG1, TG2 are constantly output from the timing generators 12a, 12b, and a waveform is generated by only varying the "1" and "0"signals of the vector memory 10.

A disadvantage of the above-described test waveform generators is that, in a case where it is necessary to change the kind of test waveform and the timing of the test waveform (e.g., in a case where an on-the-fly function is required), there is an inconvenience in that settings of the timing generators 12a, 12b and vector memory 10 must be changed. That is, in the above-described case it is also necessary to change both the timing information stored in the timing data memories 11a, 11b for each period and the "1"and "0"outputs of the vector memory 10.

In addition, the data encoded on the test waveform is in many cases prepared on the basis of simulation data for a CAE system. That simulation data includes timing information concerning times at which the vector is inverted. In a case where a vector is generated from such vector data by using a conventional formatter, it is necessary to divide the vector data into predetermined time intervals (periods) and define the vector data in terms of elements of timing (e.g., time delays $t_1$, $t_2$, shown in FIG. 2) and elements of the vector magnitude ("1", 37 0"). In this case, however, there is a drawback in that the translation software is complicated.

Furthermore, in the case where the timing pulses TG1, TG2 are constantly generated by the timing generators 12a, 12b and the waveform is generated by only varying the signals "1", "0" of the vector memory 10, there is a drawback in that if the vector memory 10 continuously outputs "8" as the vector information, the timing generators 12a, 12b constantly output the timing pulses TG1, TG2.

SUMMARY OF THE INVENTION

An important object of the present invention is to provide a test waveform generator capable of generating a desired test waveform with a high degree of flexibility in the test waveform that can be generated. A further object of the present invention is to provide a test waveform generator whose output waveform may be easily changed.

The foregoing objects are achieved by the present invention, according to which a test waveform generator comprises storage means for storing timing information defining test waveforms on the basis of a reference signal, timing generator means for generating timing pulses at predetermined intervals on the basis of the timing information and said reference signal, and waveform generating means for generating test waveforms on the basis of the timing pulses.

In a first embodiment of the present invention the timing generator means is adapted to receive a period clock signal to serve as the reference signal.

In another embodiment of the present invention the timing generator means is arranged so that the timing of each respective timing pulse is set with a previously outputted timing pulse serving as the reference signal.

In other embodiments of the present invention the waveform generating means includes means for outputting a plurality of test waveform pulses each of which has a rising edge and a falling edge, with the respective rising and falling edges of each test waveform pulse corresponding to first and second timing pulses (TG1, TG2) from the timing generator means.

In yet another embodiment of the present invention the waveform generator means further comprises a flip-flop (FF) circuit.

In yet another embodiment the timing generator means is adapted to output the first and second timing pulses (TG1, TG2) upon the lapse of first and second respective time delays ($t_1$, $t_2$) following a rising edge of the reference signal.

A preferred embodiment of the present invention comprises a storage unit for storing timing information; a timing generator unit to which the timing information is input from the storage unit and which is adapted to output a timing pulse at a predetermined time on the basis of the timing information; and a waveform generating unit to which the pulse from the timing generator unit is input and which is adapted to output a test waveform. The timing generator unit is arranged so that the timing of the timing pulse is set with either (1) a period clock serving as a reference or (2) another timing pulse serving as a reference.

In the preferred embodiment, the timing information for the test waveform is stored in a storage unit such as a memory device. The timing generator unit receives as its input the timing information from the storage unit. This timing information includes information as to whether or not the timing pulse is to be outputted when a signal concerning a predetermined reference is inputted, and, if it is to be outputted, information as to when it is to be outputted. In a case where the timing pulse is to be outputted, the timing pulse is outputted with a delay of a predetermined time after the reference time.

The rise of the period clock, the fall thereof, the time when a lamp voltage of the period clock falls below a fixed value, or the like may be adopted as the reference time.

It should be noted that the cycle (i.e., time width or period) of the period clock and the cycle of a desired test waveform need not necessarily coincide with each other. Accordingly, by adjusting the time delay of the timing generator, test waveforms corresponding to various kinds of formats may be generated.

The waveform generating unit receives as its input a pulse from the timing generator unit and outputs a test waveform based on the pulse.

In addition, the timing pulse may be outputted after a delay of a predetermined time by using as a reference the rise of a preceding timing pulse outputted by the timing generator unit.

The present invention also encompasses methods for generating test waveforms comprising the steps of storing timing information defining a test waveform on the basis of a reference signal, generating timing pulses at predetermined intervals on the basis of the timing information and said reference signal, and generating test waveforms on the basis of the timing pulses.

Other features of the present invention are described below in connection with the detailed description of preferred embodiments.

DETAILED DESCRIPTION OF PREFERRED EMBODIMENTS

Figure 3:
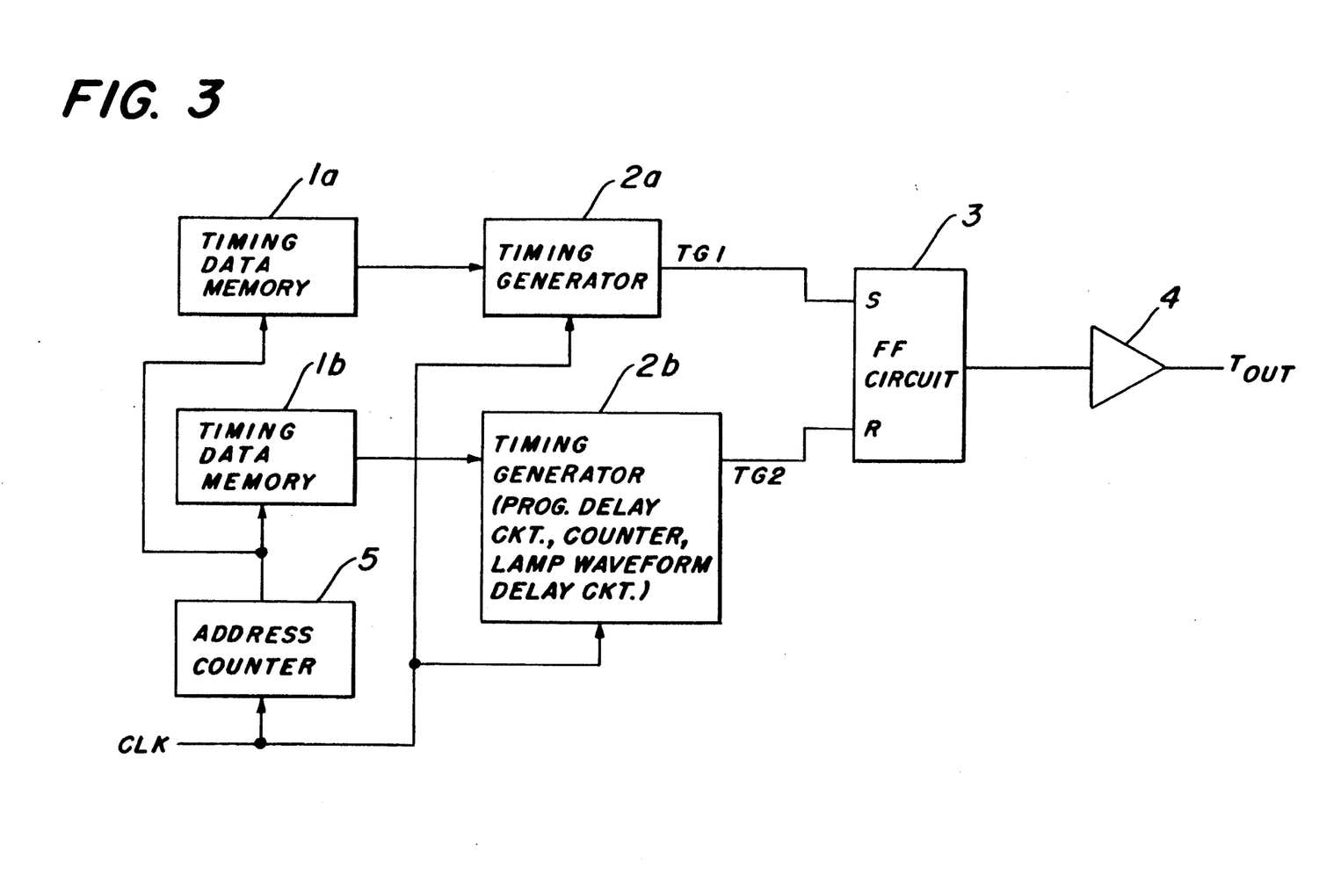
FIG. 3 is a block diagram of a first embodiment of a test waveform generator in accordance with the present invention.

FIG. 3 is a block diagram illustrating a first embodiment of a test waveform generator in accordance with the present invention. As shown, a pair of timing data memories 1a, 1b are used as storage units for storing timing information, a pair of timing generators 2a, 2b are used as timing generator units, and an FF circuit 3 and a buffer 4 are used as a waveform generating unit.

The timing data memories 1a, 1b receive as their respective input address signals from an address counter 5, and output timing information stored at that address to the timing generators 2a, 2b.

The timing generators 2a, 2b can be selected, as required, from a group of programmable delay-generating circuits, including a programmable delay circuit, a counter, and a delay-generating circuit using a lamp waveform.

The aforementioned timing information includes information as to whether or not the timing generators 2a, 2b are to output timing pulses TG1, TG2 and, if they are to output TG1, TG2, time information ($t_1$, $t_2$, etc., which is described below) defining when TG1, TG2 are to be outputted.

The timing generators 2a, 2b also receive a period clock signal CLK in addition to the timing information from the memories 1a, 1b. When signals such as RZ and NRZ signals are to be generated, the timing generators 2a, 2b output the timing pulses TG1, TG2, respectively, with predetermined time delays ($t_1$, $t_2$, etc.) from the rise of the CLK signal.

The CLK signal is also inputted to the address counter 5. The address counter 5 outputs a new address for each new period of the CLK signal. The timing data stored at a predetermined address is also outputted to the timing generators 2a, 2b.

The timing pulses TG1, TG2 are inputted to a set terminal S and reset terminal R of the FF circuit 3. The FF circuit 3 is then capable of outputting a desired test waveform $T_{OUT}$ via the buffer 4.

In the waveform generator shown in FIG. 3, the desired test waveform $T_{OUT}$ to be generated is divided appropriately into arbitrary time intervals (i.e., at each respective period of the CLK signal). Thus, the rising and falling edges of the test waveform $T_{OUT}$ are defined by times delays $t_1$, $t_2$, etc., from the starting points of the periods. The time from the starting points of the periods may be defined with respect to each period or may be defined with respect to an ensuing period or periods.

The operation of the above-described test waveform generator will be described next.

First, the timing generators 2a, 2b, upon receiving the CLK signal, determine whether or not the timing pulses TG1, TG2 are to be generated and, when they are to be generated, the timing generators 2a, 2b output the pulses TG1, TG2 to the FF circuit 3 upon the lapse of the predetermined time delays ($t_1$, $t_2$, etc.) after the rising edges of the CLK signal.

The information as to whether the TG1, TG2 pulses are to be outputted and the time delay information (i.e., $t_1$, $t_2$, etc.) is provided for each period from the timing data memories 1a, 1b.

Figure 4A:
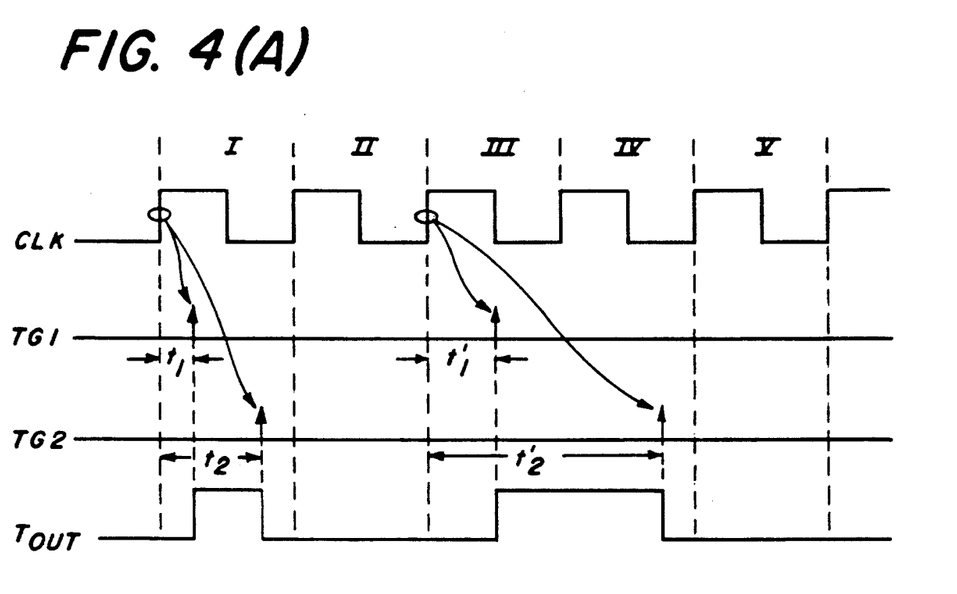
FIGS. 4(A) and 4(B) are timing charts for the block diagram of FIG. 3.

The TG1 pulses are inputted to the S terminal of the FF circuit 3, while the TG2 pulses are similarly inputted to the R terminal, with the result that the test waveform $T_{OUT}$ in the range of the period or in a range exceeding the range of the period, as shown in FIG. 4(A), is defined.

In FIG. 4(A), the test waveform $T_{OUT}$ is expressed as a mixed RZ, NRZ data string. The RZ waveform in the range of the period is generated in period I (i.e., the waveform $T_{OUT}$ returns to zero within the period labelled I).

Thus, timing generator 2a outputs the TG1 pulse to the S terminal of the FF circuit 3 upon the lapse of $t_1$ following the rising edge of the CLK signal, while timing generator 2b outputs the TG2 pulse to the R terminal of the FF circuit 3 upon the lapse of t after the rising edge of the CLK signal. (The time delays $t_1$, $t_2$, etc., are based on the vector information stored at predetermined addresses of the timing data memories 1a, 1b.) The FF circuit 3, in turn, outputs the signal $T_{OUT}$, which is formed by setting and resetting the FF 3, to a DUT or the like via the buffer 4.

In addition, in sections (or periods) III and IV a waveform exceeding the range of a period is formed. That is, the timing generator 2a outputs a TG1 pulse upon the lapse of $t'_1$ after the third rising edge of the CLK signal (period III), while timing generator 2b similarly outputs a TG2 pulse upon the lapse of $t'_2$ following the third rising edge of the CLK signal. As a result, an NRZ waveform is formed in period III and an RZ waveform is formed in period IV.

Figure 4B:
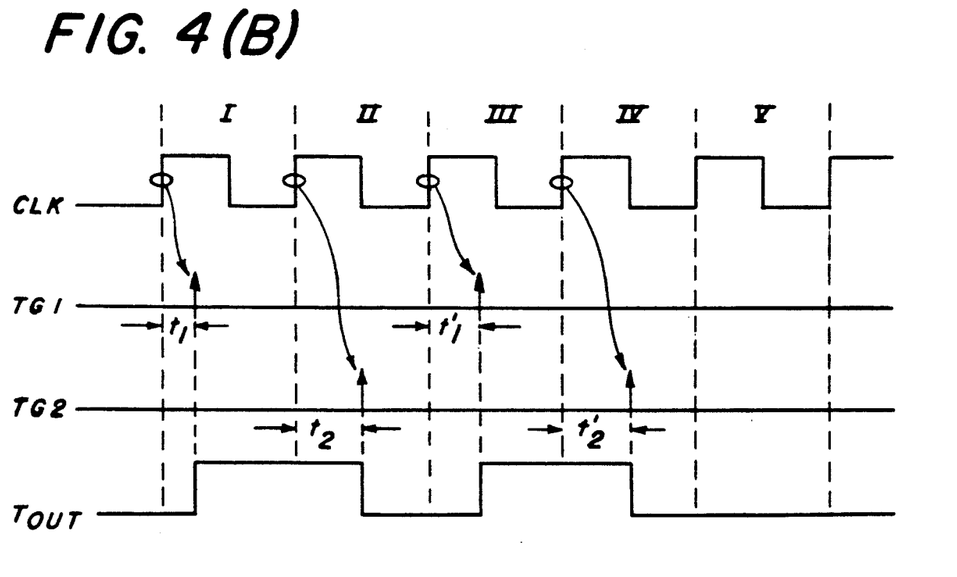

In FIG. 4(A) the respective edges of each pulse of the test waveform $T_{OUT}$ are set with the same rising edges of the CLK signal as a reference, but this embodiment is not restricted to the same. For instance, the rising and falling edges of each pulse of the test waveform $T_{OUT}$ may be set with different rising edges of different CLK signal periods as a reference, as shown in FIG. 4(B). In FIG. 4(B), the first pulse waveform of $T_{OUT}$ uses the rise of the first CLK period as a reference with respect to the rising edge, while the rise of the second CLK period is used as a reference with respect to the falling edge.

Figure 5:
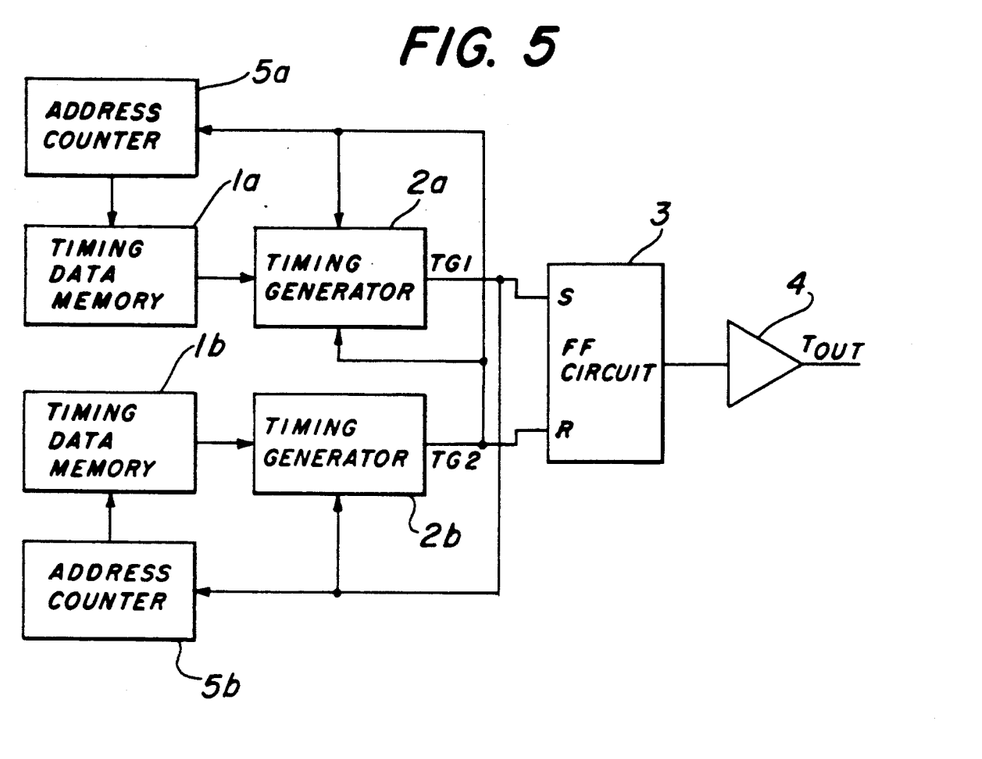
FIG. 5 is a block diagram of a second embodiment of a test waveform generator in accordance with the present invention.

FIG. 5 is a block diagram illustrating a second embodiment of a test waveform generator in accordance with the present invention. In the embodiment of FIG. 5, unlike the case of FIG. 3, the clock signal CLK does not directly contribute to the generation of a test waveform.

Timing generator 2a and an address counter 5a receive an output of timing generator 2b as their inputs, while timing generator 2b and an address counter 5b receive an output of timing generator 2a as their inputs.

Figure 6:
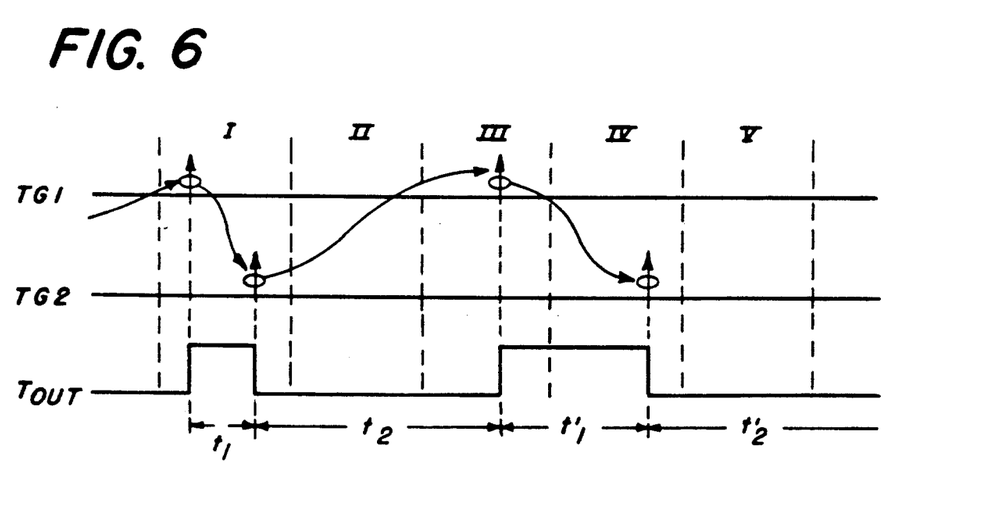
FIG. 6 is a timing chart for the block diagram of FIG. 5.

Referring now to the timing chart shown in FIG. 6, a brief description will be given of the first pulse waveform of the test waveform $T_{OUT}$ in period I. Timing generator 2a outputs a first timing pulse TG1 (the first TG1 pulse in FIG. 6) upon the lapse of a predetermined time delay after the rise of an immediately preceding timing pulse TG2 (not shown) output by timing generator 2b. Timing generator 2b outputs a timing pulse TG2 upon the lapse of time delay t after the rise of the immediately preceding timing pulse TG1 of timing generator 2a. Then, with respect to the second pulse of the test waveform $T_{OUT}$ (i.e., the pulse spanning periods III and IV), timing generator 2a similarly outputs a timing pulse TG1 (the second TG1 in FIG. 6) upon the lapse of time delay $t_2$ following the rise of the immediately preceding TG2 timing pulse. Thereafter, timing generator 2b outputs a TG2 pulse upon the lapse of time delay $t'_1$ after the rise of the immediately preceding TG1 pulse, while timing generator 2a outputs a TG1 pulse (not shown) upon the lapse of time delay $t'_2$ following the rise of the immediately preceding TG2 pulse. Thus, the FF circuit 3 generates a test waveform pulse $T_{OUT}$ of the RZ type in period I, of the NRZ type in period III and of the RZ type in period IV.

Figure 7:
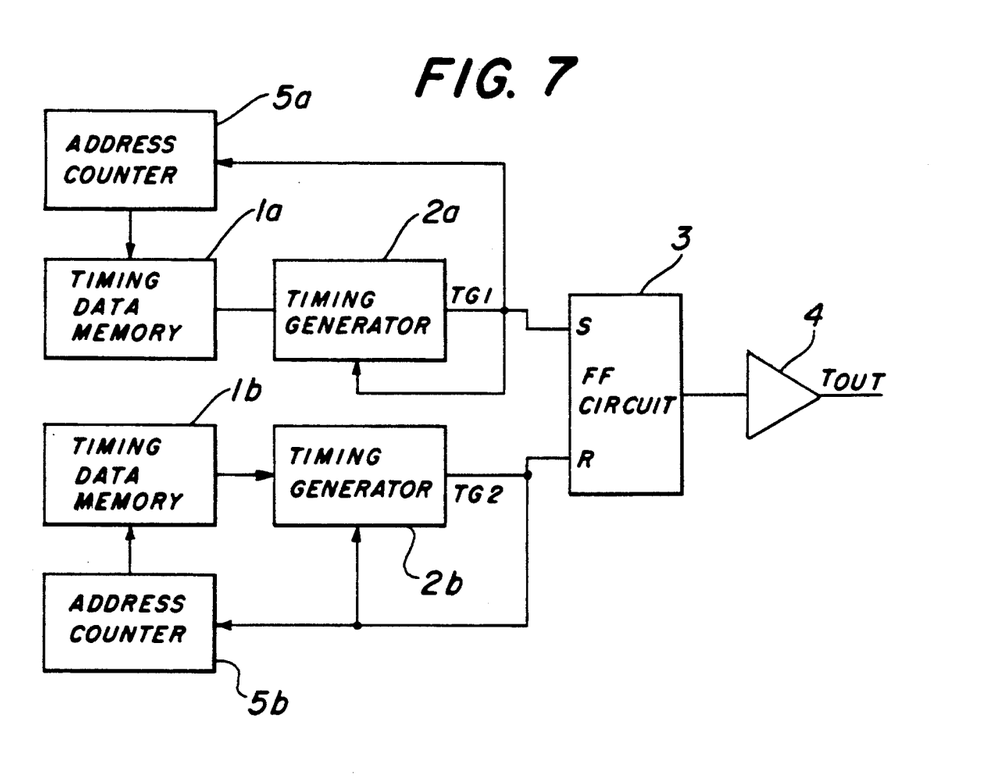
FIG. 7 is a block diagram of a third embodiment of a waveform generator in accordance with the present invention.

FIG. 7 is a block diagram illustrating a third embodiment of a test waveform generator in accordance with the present invention. In this embodiment, the period clock signal CLK does not directly contribute to the generation of the test waveform in the same way as the waveform generator depicted in FIG. 5. The timing generators 2a, 2b do not use each other's timing pulses TG1, TG2 as a reference. Rather, they define time delays $t_1$, $t_2$, etc., by using their own timing pulses TG1, TG2 as reference pulses.

Figure 8:
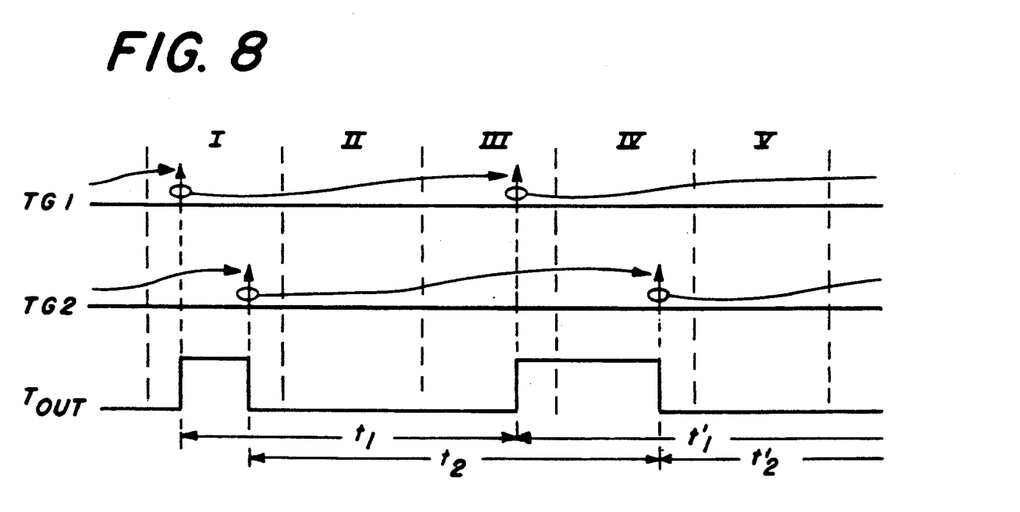
FIG. 8 is a timing chart for the block diagram shown in FIG. 7.

FIG. 8 is a timing chart illustrating the operation of the waveform generator shown in FIG. 7. In the third period (period III) of the test waveform $T_{OUT}$, timing generator 2a outputs a second TG1 timing pulse upon the lapse of time delay $t_1$ following the rise of an immediately preceding first TG1 timing pulse. In the same way as timing generator 2a, timing generator 2b outputs a second TG2 timing pulse (period IV) upon the lapse of time delay $t_2$ after the rise of the immediately preceding TG2 timing pulse. The unillustrated third $T_{OUT}$ pulse waveform is generated as timing generator 2a outputs a third TG1 pulse upon the lapse of $t'_1$ after the rise of the second TG1 pulse and timing generator 2b outputs a third TG2 pulse upon the lapse of $t'_2$ after the rise of the second TG2 pulse.

Figure 9:
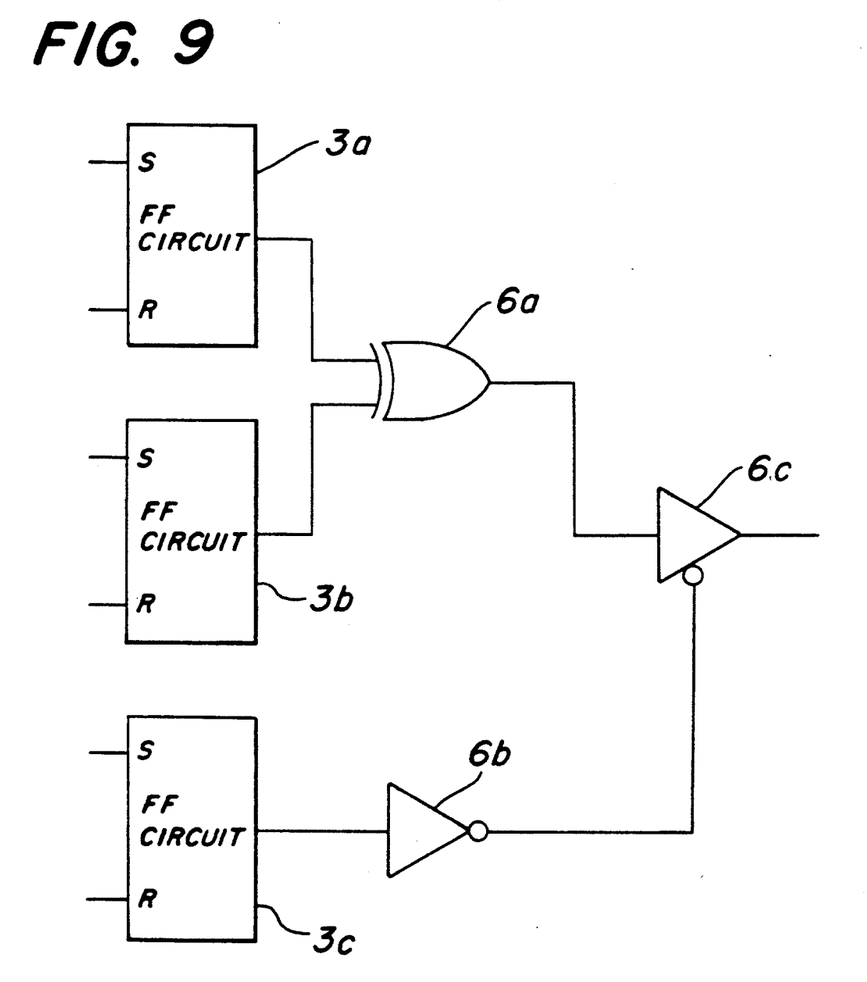
FIG. 9 is a block diagram of another example of a test waveform generating unit in accordance with the present invention.

Although in the embodiments shown in FIGS. 3, 5 and 7 a pair of timing data memories 1a, 1b and a pair of timing generators 2a, 2b are used, and the waveform generating unit is composed of FF circuit 3 and buffer 4, the present invention is not restricted to the same. For instance, an alternative arrangement may be provided such that three sets (not shown) of timing data memories and timing generators are respectively provided, and, as shown in FIG. 9, the waveform generating unit comprises FF circuits 3a–3c, an EXOR gate 6a, and NOT gates 6b, 6c. That is, a complicated test waveform may be generated by freely changing the constituent elements such as the timing data memories and the waveform generating unit, as shown in FIG. 9.

The following advantages can be obtained with the present invention:

(1) It is possible to readily generate a test waveform of a desired pattern in a case where the period of the clock signal CLK and the period of the test waveform do not coincide with each other.

(2) In addition, even in a case where an on-the-fly function is required, alteration of the format can be easily effected.

(3) Even in a case where vector information is prepared on the basis of simulation data for a CAE system, it is possible to easily prepare software for translation.

(4) In cases where "0"s are continuously outputted, outputs from the timing generators can be set to zero.

Although specific embodiments of the present invention have been described, many modifications and variations of those embodiments will be within the true scope of the invention as set forth in the following claims.

What is claimed is:

1. Apparatus for storing data defining test waveforms having a series of transitions and generating said test waveforms such that they may be applied to a device under test (DUT) during testing of said DUT by an IC tester, comprising:

a) first storage means for storing first timing information defining rising edge transitions on the basis of a first reference signal, said first timing information including an indication of whether or not a first corresponding timing pulse is to be outputted and when relative to said first reference signal it is to be outputted;

b) second storage means for storing second timing information defining falling edge transitions on the basis of a second reference signal, said second timing information including an indication of whether or not a second corresponding timing pulse is to be outputted and when relative to said second reference signal it is to be outputted;

c) timing generator means, coupled to said first and second storage means, for generating timing pulses only at said transitions of said test waveform on the basis of said first and second timing information and said first and second reference signals, said timing generator means comprising first and second output terminals for outputting first and second timing pulses (TG1, TG2); and d) waveform generating means, coupled to said timing generator means, for generating test waveforms on the basis of said timing pulses, said waveform generating means comprising a flip-flop circuit, said flip-flop circuit comprising (1) a set input terminal (S) coupled to said first output terminal of said timing generator means, (2) a reset input terminal (R) coupled to said second output terminal of said timing generator means, and (3) an output terminal for outputting said test waveforms, said test waveforms being defined by said first and second timing pulses.

2. Apparatus as recited in claim 1, wherein said timing generator means comprises means to receive a period clock signal to serve as said first and second reference signals.

3. Apparatus as recited in claim 1, wherein said timing generator means comprises means for setting the timing of each timing pulse with a previously outputted timing pulse serving as a reference signal.

4. Apparatus as recited in claim 2 or 3, wherein said waveform generating means includes means for outputting a plurality of test waveform pulses each of which has a rising edge and a falling edge, with the respective rising and falling edges of each test waveform pulse corresponding to first and second timing pulses (TG1, TG2) from said timing generator means.

5. Apparatus as recited in claim 4, wherein said waveform generating means further comprises a flip-flop (FF) circuit.

6. Apparatus as recited in claim 4, wherein said timing generator means comprises means for outputting said first and second timing pulses (TG1, TG2) upon a lapse of first and second respective time delays ($t_1$, $t_2$) following rising edges of said first and second reference signals.

7. Apparatus as recited in claim 4, wherein said timing generator means comprises at least one member of the following group of programmable delay-generating circuits: a programmable delay circuit, a counter, and a delay-generating circuit using a lamp waveform.

8. A method for storing data defining test waveforms having a series of transitions and generating said test waveforms such that they may be applied to a device under test (DUT) during testing of said DUT by an IC tester, comprising the steps of:

a) storing first timing information defining rising edge transitions on the basis of a first reference signal, said first timing information including an indication of whether or not a first corresponding timing pulse is to be outputted and when relative to said first reference signal it is to be outputted;

b) storing second timing information defining falling edge transitions on the basis of a second reference signal, said second timing information including an indication of whether or not a second corresponding timing pulse is to be outputted and when relative to said second reference signal it is to be outputted;

c) generating timing pulses only at said transitions of said test waveform on the basis of said first and second timing information and said first and second reference signals; and d) generating test waveforms on the basis of said timing pulses, said test waveforms defined and generated by feeding said timing pulses to a flip-flop circuit and outputting said test waveforms from said flip-flop circuit.

9. A method as recited in claim 8, wherein a clock signal serves as said first and second reference signals.

10. A method as recited in claim 8, wherein the timing of each respective timing pulse is set with a previously outputted timing pulse serving as said first and second reference signals.

11. A method as recited in claim 9 or 10, further comprising the step of outputting a plurality of test waveforms pulses each of which has a rising edge and a falling edge, with the rising and falling edges of each respective test waveform pulse corresponding to first and second timing pulses (TG1, TG2).

12. A method as recited in claim 10, further comprising the step of outputting said first and second timing pulses (TG1, TG2) upon a lapse of first and second respective time delays ($t_1$, $t_2$) following rising edges of said first and second reference signals.

* * * * *